(12) United States Patent
Okubo et al.

(10) Patent No.: US 6,741,128 B2
(45) Date of Patent: May 25, 2004

(54) DISTORTION CANCELING CIRCUIT

(75) Inventors: Yoichi Okubo, Tokyo (JP); Kiyoshi Funada, Tokyo (JP); Masaki Suto, Tokyo (JP); Masato Horaguchi, Tokyo (JP); Toshio Takada, Tokyo (JP); Naoki Hongo, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 16 days.

(21) Appl. No.: 10/131,131

(22) Filed: Apr. 25, 2002

(65) Prior Publication Data

US 2002/0180523 A1 Dec. 5, 2002

(30) Foreign Application Priority Data

Apr. 27, 2001 (JP) ........................................ 2001-133496

(51) Int. Cl.[7] ................................................. H03F 1/26
(52) U.S. Cl. ........................ 330/149; 330/132; 330/136
(58) Field of Search ................................. 330/132, 136, 330/149; 455/63

(56) References Cited

U.S. PATENT DOCUMENTS 4,249,214 A * 2/1981 Boyd ........................ 455/92 X
6,445,249 B1 * 9/2002 Khan et al. .................. 330/149
6,512,417 B2 * 1/2003 Booth et al. ................. 330/149

* cited by examiner

Primary Examiner—Steven J. Mottola
(74) Attorney, Agent, or Firm—Bacon & Thomas, PLLC

(57) ABSTRACT

There is provided a distortion canceling circuit for reducing an unbalance between a higher and a lower 3rd order distortion at frequencies of $(2 \cdot f2-f1)$ and $(2 \cdot f1-f2)$, respectively, the distortions being generated by an amplifier which amplifies an input signal having at least two frequency components, i.e., $f1$ and $f2$. Phase modulation control means supply a control signal, which has a difference frequency of $(f2-f1)$, to phase modulation means, the control signal being generated based on the amplified input signal outputted from the amplifier. The phase modulation means performs phase modulation on the amplified input signal based on the supplied control signal to thereby generate a higher and a lower side-band signal having frequencies of $(2 \cdot f2-f1)$ and $(2 \cdot f1-f2)$, respectively, each of which has an identical amplitude and a phase difference of 180° with respect to each other. The distortion canceling circuit reduces the unbalance by using the side-band signals.

3 Claims, 16 Drawing Sheets

DISTORTION CANCELING CIRCUIT

FIELD OF THE INVENTION

The present invention relates to a distortion canceling circuit for use in an amplifier; and, more particularly, to a distortion canceling circuit for reducing an unbalance between an upper 3rd-order distortion and a lower 3rd-order distortion generated by the amplifier.

BACKGROUND OF THE INVENTION

In general, a distortion is generated in the course of amplifying a signal in an amplifier. Therefore, in a communications device which amplifies a communications signal by using an amplifier, there is needed to cancel a distortion caused in the course of amplifying a signal, e.g., a W-CDMA (wide-banded code division multiple access) signal or a multi-carrier signal, by using the amplifier.

FIG. 11 illustrates, as an amplifying device using a distortion canceling method of the prior art, an example of an amplifying device which cancels a distortion by using a distortion canceling circuit adopting a feed-forward method.

In the amplifying device shown in FIG. 11, an input signal (a main signal) is distributed in two ways by a distributor 81. A distributed signal is amplified by an amplifier (a main amplifier) 82 to thereby be inputted into a subtractor 84, and another distributed signal is inputted into the subtractor 84 through a delay line 83. In the subtractor 84, a distortion component is extracted by deducting the signal inputted from the delay line 83 from the amplified signal inputted from the main amplifier 82. The distortion component is inputted therefrom into a distortion amplifier 85 and the amplified signal, which includes the distortion component, inputted from the main amplifier 82 is outputted to another subtractor 87 through another delay line 86. Further, the distortion component, which is extracted by the subtractor 84, is amplified by the distortion amplifier 85 to thereby be outputted to the subtractor 87. The subtractor 87 generates a final amplified signal without a distortion by deducting the amplified distortion component inputted from the distortion amplifier 85 from the amplified signal, which includes the distortion component, inputted from the delay line 86.

Here, the signal inputted from the delay line 86 to the subtractor 87 is generated by amplifying the input signal in the main amplifier 82 and the signal includes a distortion caused by the main amplifier 82. Further, the signal inputted from the distortion amplifier 85 to the subtractor 87 is generated by amplifying the distortion. Therefore, the output signal from the subtractor 87 is considered to be a signal generated by canceling the distortion caused by the main amplifier 82, i.e., deducting the distortion from the amplified signal generated by the main amplifier 82. Further, each of the distributor 81 and the subtractors 84 and 87 comprises, e.g., a directional coupler.

However, in such an amplifying device as described above, there is a problem of poor efficiency in the main amplifier 82. This is caused by a fact that an amplified signal outputted from the main amplifier 82 is attenuated while passing through the subtractor 84, the delay line 86 or subtractor 87, which requires an increase of an output level of the main amplifier 82 in accordance with a required output level of the amplifying device.

Meanwhile, FIG. 12 exhibits an example of an amplifying device having a distortion canceling circuit adopting a pre-distortion method.

The amplifying device of FIG. 12 has a pre-distortion circuit 91 coupled to an input of a main amplifier 92. The pre-distortion circuit 91 generates a distortion before a main signal being generated, a phase of the distortion having a difference of 180° with respect to a distortion (i.e., an opposite phase) and a same amplitude as that of the distortion, the distortion being generated by the main amplifier 92. Therefore, the distortion caused by the main amplifier 92 is canceled by the distortion generated by the pre-distortion circuit 91.

Such an amplifying device can be implemented to obtain a high efficiency since any other circuits are not coupled to an output of the main amplifier 92. However, in this case, the distortion generated by the pre-distortion circuit 91 should have same characteristic as that generated by the main amplifier 92 regardless of the variation or frequency characteristics of an input signal.

Here, it is understood by those skilled in the art that the distortion caused by the main amplifier is due to an AM—AM (amplitude modulation—amplitude modulation) conversion or an AM-PM (amplitude modulation—phase modulation) conversion.

FIG. 13A charts a graph showing an example of the AM—AM conversion performed in the main amplifier. The horizontal and vertical axes of the graph represent an input level and a gain of the main amplifier, respectively. FIG. 13A shows an ideal gain characteristic (G1) together with those (G2 and G3) of the main amplifier and the pre-distortion circuit. As shown in FIG. 13A, the ideal gain characteristic (G1) can be obtained by combining those (G2 and G3) of the main amplifier and the pre-distortion circuit.

Further, FIG. 13B exhibits a graph showing an example of the AM-PM conversion performed in the main amplifier. The horizontal and vertical axes of the graph represent an input level and an output phase of the main amplifier, respectively. FIG. 13B shows an ideal phase characteristic (P1) together with those (P2 and P3) of the main amplifier and the pre-distortion circuit. As shown in FIG. 13B, the ideal gain characteristic (P1) can be obtained by combining those (P2 and P3) of the main amplifier and the pre-distortion circuit.

However, as shown in FIGS. 13A and 13B, characteristics of the AM—AM and the AM-PM conversion are so complicated that characteristic of the pre-distortion circuit must have a complicated function to implement an amplifying device having the above described ideal characteristics. Therefore, it is so difficult to calculate coefficients of the characteristic functions by using an analog approach.

Accordingly, as an alternative amplifying device having a distortion canceling circuit adopting the pre-distortion method, there has been proposed an amplifying device as shown in FIG. 14.

In the amplifying device of FIG. 14, an input signal, e.g., an RF (radio frequency) signal, is branched by a branch circuit 101. A branch signal is outputted from the branch circuit 101 to an amplitude/phase circuit 107 through a delay circuit 102. Another branch signal is outputted from the branch circuit 101 to an amplitude detector (envelope detector) 103.

The amplitude detector 103 detects an amplitude level (envelope level) of the inputted branch signal. And then, the detected amplitude level is converted into a digital signal by an A/D (analog to digital) converter 104. The digital signal is inputted to a table 105.

The table 105 stores data for the correction of an amplitude and a phase of a signal together with a corresponding amplitude level of the signal. Therefore, when the digitized amplitude level outputted from the A/D converter 104 is inputted to the table 105, corresponding data for amplitude and phase correction are read from the table 105 to thereby be outputted to a D/A (digital to analog) converter 106. The D/A converter 106 converts the data for amplitude and phase correction into an analog signal, the analog signal being inputted to the amplitude/phase circuit 107.

The branch signal, which is delivered from the branch circuit 101 to the amplitude/phase circuit 107 through the delay circuit 102, is synchronized with the data for amplitude and phase correction from the D/A converter 106.

Accordingly, in the amplitude/phase circuit 107, the delayed branch signal inputted from the delay circuit 102 is distorted in its amplitude and phase by using the data for amplitude and phase correction from the D/A converter 106. The amplitude and phase distortion imposed on the delayed branch signal by the amplitude/phase circuit 107 is subsequently cancelled by amplitude and phase distortion generated by a main amplifier 108. That is, the amplifying device has such a characteristic that AM—AM or AM-PM conversion is performed therein according to an input level thereof. However, as shown in FIGS. 13A and 13B, such a characteristic is cancelled by an opposite characteristic which is generated by the amplitude and phase correction data stored in the table 105, which results in an ideal characteristic of the amplifying device.

The signal amplified by the main amplifier 108 is outputted as a final output signal through another branch circuit 109. Further, in the branch circuit, a part of the amplified signal from the main amplifier 108 is branched to a distortion detector 110.

The distortion detector 110 extracts a distortion component remaining in the branch signal from the branch circuit 109 after the distortion canceling, the remaining distortion component being outputted to a table update circuit 111.

The table update circuit 111, based on the distortion component detected by the distortion detector 110, calculates amplitude and phase correction data for further canceling the distortion component remaining in the branch signal from the branch circuit 109. Subsequently, the amplitude and phase correction data are stored into the table 105. In this way, the amplitude and phase correction data stored in the table 105 are updated to minimize the amplitude and phase distortion caused by the amplifying device. Further, through the update of the amplitude and phase correction data by using the above described feed-back system, the amplifying device can operate in an efficient manner regardless of any effect caused by, e.g., a temperature change or a secular change.

FIG. 15 illustrates an example of amplitude and phase correction data, the values of which are optimized to cancel the distortion generated by the main amplifier, outputted from the table 105. The horizontal axis represents an envelope level of an input signal, i.e., an RF signal, (=an output level of the delay circuit 102). Higher and lower parts of the vertical axis represent an output value of the table 105 and time, respectively. That is, in FIG. 15, the horizontal axis and the lower part of the vertical axis make up a graph that shows a relationship between the time and the envelope level of the RF signal. Further, the horizontal axis and the higher part of the vertical axis make up a graph that exhibits a relationship between the output value of the table 105 and the envelope level of the RF signal. As shown in FIG. 15, when the envelope level of the RF signal changes with respect to the time, a value corresponding to the envelope level is outputted from the table 105.

Meanwhile, the degree of the distortion generated by the main amplifier depends on the frequency of the RF signal, which results in unpredictable characteristics of the distortion.

FIG. 16 shows an example of two output signals and corresponding distortions generated by a main amplifier when two input signals, each of which has a different frequency, e.g., f1 or f2, are inputted to the main amplifier. In FIG. 16, the horizontal and vertical axes represent frequency and amplitude level of the signals, respectively. FIG. 16 charts IM (intermodulation) distortion components, i.e., a lower 3rd order distortion and a higher 3rd order distortion at frequencies of $(2 \cdot f1-f2)$ and $(2 \cdot f2-f1)$, respectively, wherein f2 is larger than f1 (f2>f1).

As shown in FIG. 16, when each of the amplitude levels of the two input signals has an identical value, there is introduced an amplitude difference $\Delta IM$ (=B−A) between an amplitude level (A) of the lower 3rd order distortion and that (B) of the higher 3rd order distortion at the frequencies of $(2 \cdot f1-f2)$ and $(2 \cdot f2-f1)$, respectively. In this case, although the pre-distortion circuit of the amplifying device operates in an ideal state, an identical distortion canceling process is performed with respect to the whole range of frequencies, such that a distortion component corresponding to the amplitude difference $\Delta IM$ cannot be canceled by such a distortion canceling process.

Further, such an amplitude difference, $\Delta IM$, is caused by a distortion factor other than what the main amplifier has in general. For example, 3rd order distortion components, which are generated by the main amplifier, have the same amplitude levels at the frequencies of $(2 \cdot f1-f2)$ and $(2 \cdot f2-f1)$, respectively.

Even when ordinary distortion components, i.e., 3rd order distortion components, can be cancelled by the pre-distortion circuit having characteristics opposite to those of the 3rd order distortion components, $\Delta IM$ shown in FIG. 16 cannot be cancelled by the pre-distortion circuit. For example, when A, B and $\Delta IM$ are set to be 1.0, 0.8 and 2 dB=0.2, respectively, a distortion component other than the ordinary distortion component becomes 0.1 and the ordinary distortion component becomes $\{B+(A-B)/2\}=0.9$. In this case, since the distortion component other than the ordinary distortion component remains after distortion canceling performed by the pre-distortion circuit, the amount of distortion canceling becomes only $|20 \text{ Log}(0.1/0.9)|=19$ dB. Further, the larger $\Delta IM$ becomes, the smaller the amount of distortion canceling becomes.

Meanwhile, the amplifying device shown in FIG. 11, which has the distortion canceling circuit adopting the feed-forward method, can obtain an amount of distortion canceling of more than 30 dB. Therefore, as for the amount of distortion canceling, the amplifying device using the feed-forward method operates in a more efficient manner than that using the pre-distortion circuit.

There are several factors that cause the amplitude difference $\Delta IM$. For example, a distortion having a difference frequency of (f2−f1) is generated due to an even order distortion caused by a transistor included in the main amplifier, and the input signals having frequencies of f1 and f2 are modulated due to the distortion caused by the transistor. This is one of factors that may cause the amplitude difference $\Delta IM$. Such a distortion becomes more apparent when, as in an AB-class amplifier, the variation of drain current thereof is relatively large. Further, when an input signal having a frequency component of f1 or f2 is mixed with a signal having a frequency twice the frequency component, i.e., 2·f1 or 2·f2, the amplitude difference ΔIM may be also introduced.

As described above, the amplifying device of the prior art, having the pre-distortion circuit for distortion canceling, has such a problem that there is an unbalance between the higher 3rd order distortion and the lower 3rd order distortion, wherein the unbalance cannot be canceled by the pre-distortion circuit.

SUMMARY OF THE INVENTION

It is, therefore, an object of the present invention to provide a distortion canceling circuit for canceling an unbalance between a higher 3rd order distortion and a lower 3rd order distortion generated when an input signal having more than two frequency components is amplified by an amplifier.

In accordance with a preferred embodiment of the present invention, there is provided a distortion canceling circuit for reducing an unbalance between a higher 3rd order distortion and a lower 3rd order distortion generated by an amplifier which amplifies an input signal having at least two frequency components, the distortion canceling circuit comprising: phase modulation means for performing phase modulation on the input signal by using a control signal having a frequency corresponding to a difference between the frequency components wherein the distortion canceling circuit cancels the unbalance by using side-band signals generated as a result of the phase modulation performed by the phase modulation means.

Here, the amplifier for amplifying the input signal having more than two frequency components is so called a common amplifier.

Further, as the phase modulation means, a phase modulator or a gate-source capacitance, which will be described later, can be used.

Further, the input signal may have, e.g., only two or more than three frequency components, or a frequency band which includes continuous frequency components.

Further, the unbalance between the higher 3rd order distortion and the lower 3rd order distortion means a phase difference or an amplitude difference therebetween.

Further, the difference between the frequency components of the input signal has a frequency component of (f2−f1) when the input signal has frequency components of f1 and f2. However, when the input signal includes more than three frequency components or a frequency band, the difference component is determined by summing differences between pairs of all the frequency components included therein.

In general, if 3rd order distortions can be expressed by using a two-frequency model, it is understood that it can be explained by using a multiple-frequency model. When n is a plural number, difference components of a signal having n frequency components can be detected by performing square detection. For instance, a signal having three frequency components, i.e., ω1, ω2 and ω3, can be expressed by performing square detection as follows: $\{\cos(\omega 1 \cdot t) + \cos(\omega 2 \cdot t) + \cos(\omega 3 \cdot t)\}^2 = \{\cos(\omega 1 \cdot t) + \cos(\omega 2 \cdot t)\}^2 + 2 \cdot \cos(\omega 3 \cdot t) \cdot \{\cos(\omega 1 \cdot t) + \cos(\omega 2 \cdot t)\} + \{\cos(\omega 3 \cdot t)\}^2$. In the above equation, a difference component of (ω2−ω1) can be obtained from the first term of the right side. Further, difference components of (ω3−ω1) and (ω3−ω2) can be obtained from the second term of the right side.

In case higher 3rd order distortions and lower 3rd order distortions generated due to only a part of frequency components of the input signal are to be canceled, the difference components of the input signal, i.e., the control signal of the present invention, becomes differences between the part of frequency components. The present invention can be also applied for such a case.

Further, the control signal of the present invention is preferably generated from the input signal before being amplified by the amplifier. However, the control signal may be generated from the amplified input signal. That is, when the control signal is generated from the input signal, the control signal can closely follow the variation of the input signal. Meanwhile, although the control signal generated from the amplified input signal cannot follow the input signal as closely as the control signal generated from the input signal, the control signal can be also used for reducing the unbalance between the higher 3rd order distortion and the lower 3rd order distortion generated by the amplifier.

Further, in case the frequency components, i.e., f1 and f2, of the input signal can be determined prior to the input signal being inputted to the amplifier, a signal having a difference frequency, e.g., (f2−f1), can be also used as a control signal for the amplifier.

In the present invention, the side-band signals include a higher side-band signal and a lower side-band signal generated at frequencies of the higher 3rd order distortion and the lower 3rd order distortion, respectively. The present invention is able to reduce the unbalance between the higher and the lower 3rd order distortion by combining such a side-band signal with the higher and the lower 3rd order distortion generated by the amplifier.

Meanwhile, the phase modulation means of the present invention comprises a gate-source capacitance included in a transistor, the gate-source capacitance being varied according to a voltage of the control signal applied to a gate of the transistor. When the amplifier comprises a plurality of transistors, for example, at least one of the transistors can be the above-described transistor.

Preferably, the present invention cancels the higher 3rd order distortion and the lower 3rd order distortion generated in the amplifier by jointly using a pre-distortion circuit positioned in front of the amplifier and the phase modulation means.

On the other hand, firstly, the distortions generated by the amplifier are canceled by using the pre-distortion circuit, and then the higher and the lower 3rd order distortion each of which remains after the cancellation performed by the pre-distortion circuit is canceled by the phase modulation means.

Here, while the phase modulation means generates a higher side-band signal and a lower side-band signal between which there exists an unbalance, the pre-distortion circuit generates a higher 3rd order distortion and a lower 3rd order distortion each of which has the same amplitude and phase as those generated by the amplifier (i.e., there exists a balance therebetween). Although an ideal case is described herein, a pre-distortion circuit used in the state of the art does not necessarily produce balanced distortions. Such a characteristics of the pre-distortion circuit may be applied for the other descriptions thereon in the specification.

The pre-distortion circuit, for example, can include a combination of a variable attenuator for performing distortion canceling for the AM—AM conversion and a variable phase controller for performing distortion canceling for the AM-PM conversion.

Although it is preferable that the pre-distortion circuit positioned in front of the amplifier of the present invention is used together with the phase modulation means, a distortion canceling circuit positioned after the amplifier can be also used.

In general, a large portion of distortions caused by an amplifier having a series of transistors is generated in a transistor positioned at the end of the series. This is because the transistor positioned at the end of the series operates in a state of high efficiency, which causes a high output level of the transistor. However, when a front end of the series needs to operate in a state of high efficiency, a distortion canceling circuit can be inserted somewhere in between a first and a last transistor of the series. In a configuration where a distortion canceling circuit (post-distortion circuit) is positioned after the last transistor of the series, it is also necessary to increase the output level of the last transistor to compensate a loss of the distortion canceling circuit.

Further, although the present invention uses the side-band signals, which are generated due to the phase modulation of the input signal, to reduce the unbalance between the higher 3rd order distortion and the lower 3rd order distortion, the side-band signals can be also used for other purposes. Further, e.g., when the amount of the distortions is relatively small, the distortions can be canceled by using only the phase modulation.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
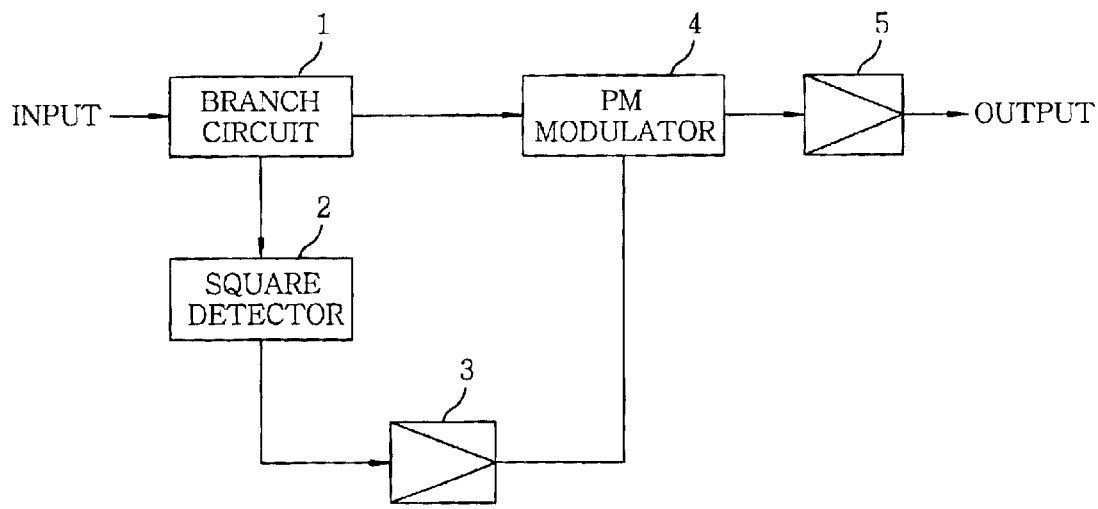
FIG. 1 illustrates an exemplary configuration of an amplifying device including a distortion canceling circuit in accordance with a first preferred embodiment of the present invention.

In the following, a distortion canceling circuit in accordance with a preferred embodiment of the present invention will be described.

The distortion canceling circuit in accordance with the present invention reduces an unbalance between a higher 3rd order distortion and a lower 3rd order distortion generated by an amplifier. In order to reduce the unbalance, phase modulation means generates side-band signals corresponding to an input signal to be amplified in the amplifier by performing phase modulation on the input signal. Here, the side-band signals are generated by producing signals having phases, each of which has a difference of 180° with respect to each other, at a higher frequency and a lower frequency, respectively.

In this way, the present invention can further reduce the distortion of the amplifier when it operates in combination with the pre-distortion circuit of the prior art which performs distortion canceling by generating distortions, each of which having an identical phase and amplitude corresponding to the distortion throughout the whole range of frequencies.

Here, the input signal to be amplified by the amplifier can be of any type of signal, e.g., a W-CDMA signal or a multi-carrier signal.

Further, the amplifier of the present invention can be of any type of amplifier, e.g., a single amplifier or a series of amplifiers.

Meanwhile, the precision, with which the distortion canceling in accordance with the present invention is performed, is preferably set such that the distortion generated by the amplifier is completely canceled. However, on condition that the degree of the precision is practically acceptable, the distortion canceling can be performed in accordance with a variety of precisions.

Further, the phase modulation in accordance with the present invention can be performed on the original input signal as well as on the input signal amplified by the amplifier. Likewise, the phase modulation means can be positioned in front of or after the amplifier.

For example, if it is assumed that an input signal having frequency components f1 and f2 is inputted to the amplifier and there exists an unbalance between a higher 3rd order distortion and a lower 3rd order distortion at frequencies (2·f2−f1) and (2·f1−f2), respectively, which are caused by the amplifier, the distortion canceling circuit in accordance with the present invention cancels the distortions as follows:

That is, phase modulation control means supplies a control signal, which has a difference frequency of (f2−f1), to the phase modulation means, the control signal being generated based on the amplified input signal outputted from the amplifier. And then, the phase modulation means, which includes a phase modulator, performs phase modulation on the amplified input signal based on the supplied control signal to thereby generate a higher side-band signal having a frequency of (2·f2−f1) and a lower side-band signal having a frequency of (2·f1−f2), each of which has a phase difference of 180° with respect to each other and an identical amplitude.

Therefore, when an input signal having frequencies of f1 and f2 is amplified by the amplifier, in comparison with the prior art, the present invention can reduce further the unbalance between the higher 3rd order distortion having the frequency of (2·f2−f1) and the lower 3rd order distortion having the frequency of (2·f1−f2), each of which has a phase difference of 180° with respect to each other.

In this case, the input signal to be amplified by the amplifier may have only two frequency components f1 and f2, or it may have another frequency component in addition to the two frequency components.

Further, the phase modulation control means generates the control signal based on the original input signal or the input signal amplified by the amplifier.

Further, the amplifier may include a transistor having a variable capacitance. Here, the transistor can be of any type of transistor, e.g., a FET (field-effect transistor) or a bipolar transistor.

In another preferred embodiment, a distortion canceling circuit adopting a pre-distortion method in accordance with the present invention includes: distortion canceling means for generating a higher 3rd order distortion and a lower 3rd order distortion at frequencies of (2·f2−f1) and (2·f1−f2), respectively, each of which has identical amplitude and phase with respect to an input signal to be amplified by an amplifier; and phase modulation means for generating side-band signals wherein the distortion canceling circuit cancels distortions at the frequencies of (2·f2−f1) and (2·f1−f2), which are caused by the amplifier, by summing the side-band signals and the higher and lower 3rd order distortions generated by the distortion canceling means.

Therefore, the distortion canceling circuit of the present invention can cancels the higher and lower 3rd order distortions, which are generated by the amplifier, with high precision by summing the side-band signals, each of which has a same amplitude and a phase difference of 180° with respect to each other, generated by the phase modulation means and the distortions, each of which has the same amplitude and phase with respect to each other, generated by the distortion canceling means at the frequencies of (2·f2−f1) and (2·f1−f2).

An underlying principle of the present invention now will be described in detail.

Figure 7A:
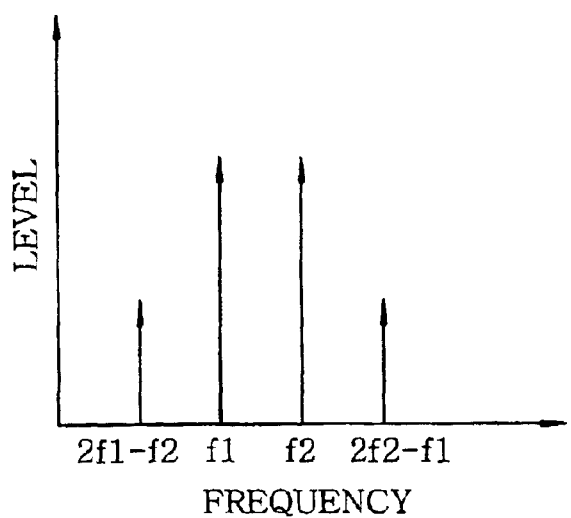
FIGS. 7A to 7H chart exemplary signal spectra to describe a method for canceling distortion components.

FIG. 7A illustrates spectra of IM distortions and an input signal having frequencies of f1 and f2 after the amplification thereof by the amplifier. In FIG. 7A, the horizontal and vertical axes represent frequency and level of signals, respectively.

Figure 7B:
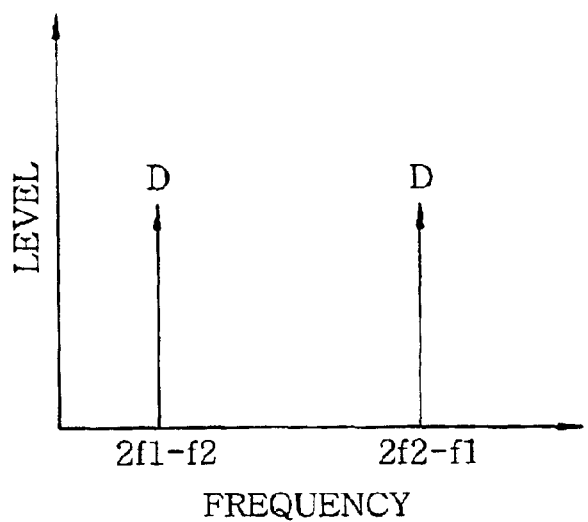

FIG. 7B charts higher and lower 3rd order IM distortions, each of which has a frequency of (2·f1−f2) or (2·f2−f1) and is represented as a vector D. In FIG. 7B, the horizontal and vertical axes represent frequency and level of signals, respectively.

Figure 7C:
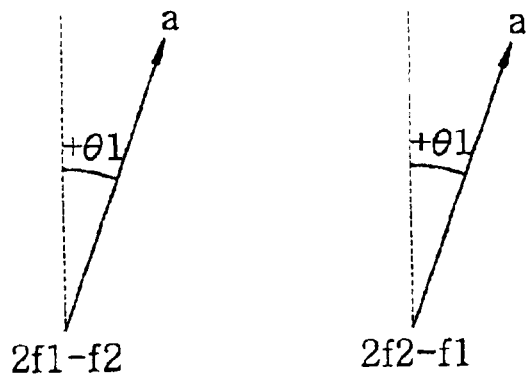

FIG. 7B shows IM distortions when the AM—AM conversion but not the AM-PM conversion is performed. However, when the AM-PM conversion together with the AM—AM conversion is performed, IM distortions as shown in FIG. 7C are generated. That is, as shown in FIG. 7C, a lower 3rd order distortion having a frequency of (2·f1−f2) has a phase difference of +θ1 clockwise with respect to the vector D. Likewise, a higher 3rd order distortion having a frequency of (2·f2−f1) has a phase difference of +θ1 clockwise with respect to the vector D. Hereinafter, a vector having a phase difference of +θ1 clockwise with respect to the vector D is referred to a vector a. A description on such a phase change as described above is given in Suematsu, Iyama and Ishida, "Transfer Characteristic of IM3 Relative Phase for a GaAs FET Amplifier," IEEE TRANSACTIONS ON MICROWAVE THEORY AND TECHNIQUES, VOL. 45, NO. 12, DECEMBER 1997.

Figure 7D:
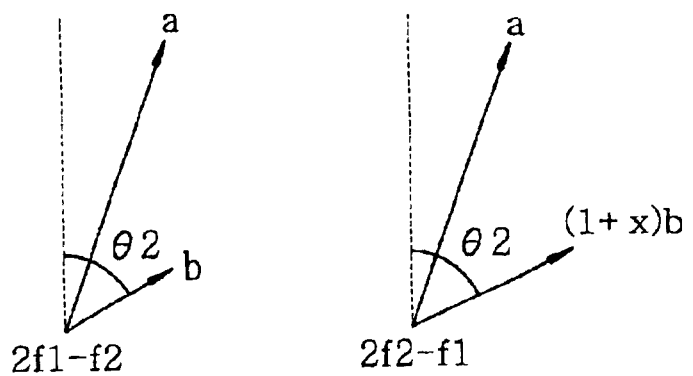

Further, as shown in FIG. 7D, due to a factor other than a common factor for causing distortions, another distortion, i.e., a vector b, is added to the lower 3rd order distortion at the frequency of (2·f1−f2). Also, another distortion, i.e., a vector (1+x)b wherein (1+x) is a coefficient of the vector b, is added to the higher 3rd order distortion at the frequency of (2·f2−f1). Here, the added distortions, i.e., the vectors b and (1+x)b, have a phase difference of +θ2 clockwise with respect to the vector D. In FIG. 7D, to facilitate the explanation, the amount of phase change (θ2) is shown larger than what it is. In general, each of the distortions at the frequencies of (2·f1−f2) and (2·f2−f1) has no phase difference with respect to each other when the distortions are generated due to the identical factor.

Figure 7E:
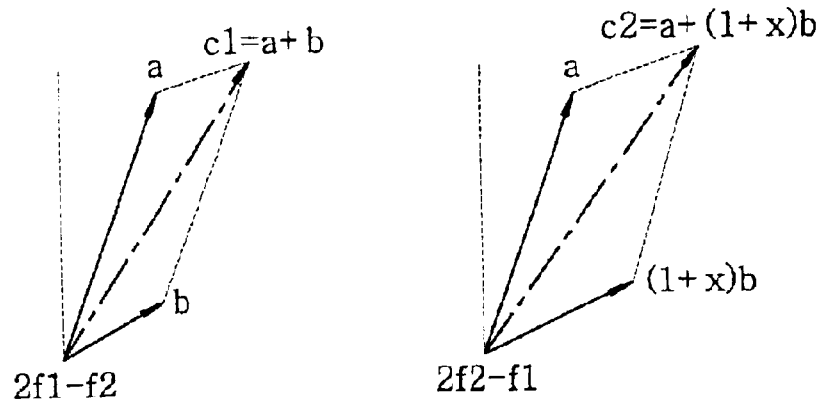

As shown in FIG. 7E, if the two vectors a and b representing distortions at the frequency of (2·f1−f2) is summed, the lower 3rd order distortion can be represented as a vector c1=a+b. Likewise, the higher 3rd order distortion at the frequency of (2·f2−f1) can be represented as a vector c2=a+(1+x)b. Here, |c1|<|c2|, which means that there exits an unbalance between the IM distortions.

Figure 7F:
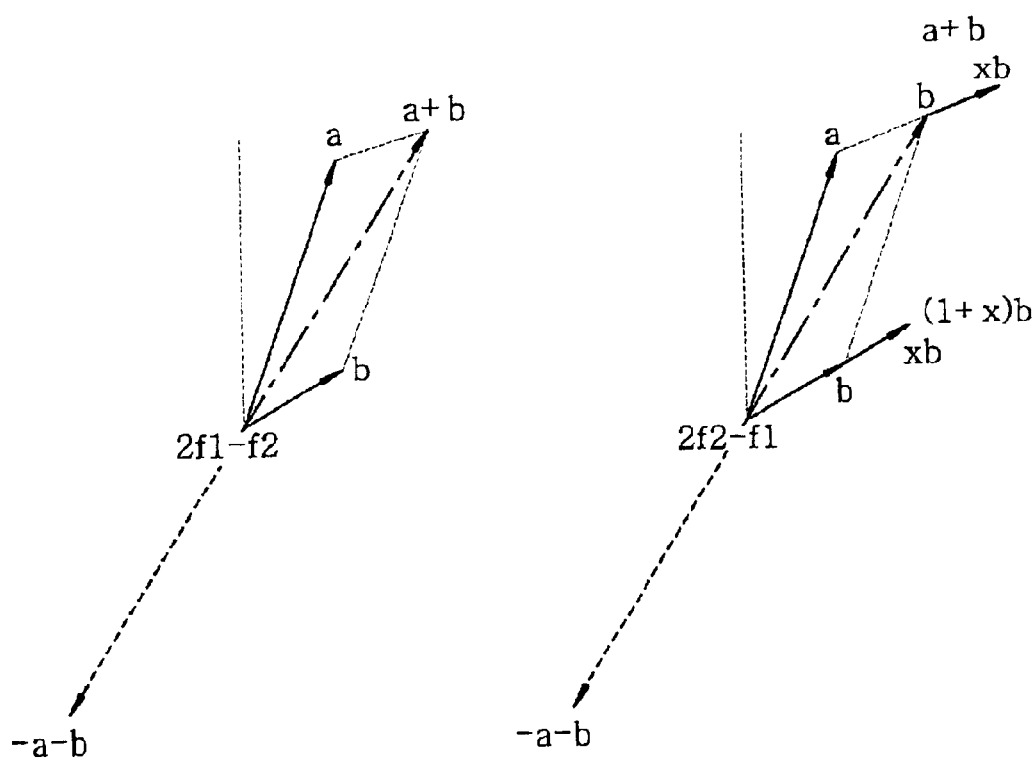
Figure 14:
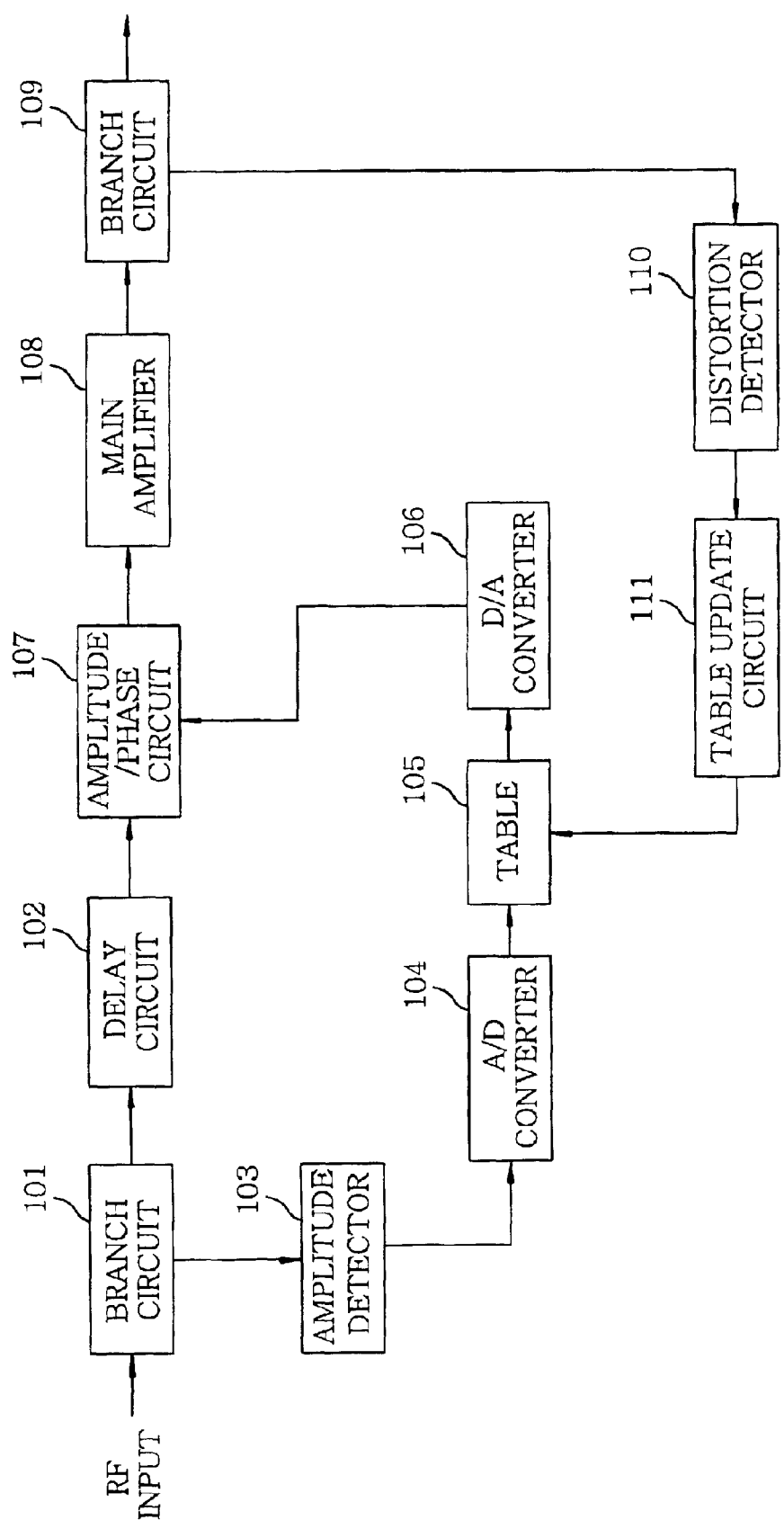
FIG. 14 exemplifies another conventional amplifying device including a distortion canceling circuit adopting a pre-distortion method.
Figure 15:
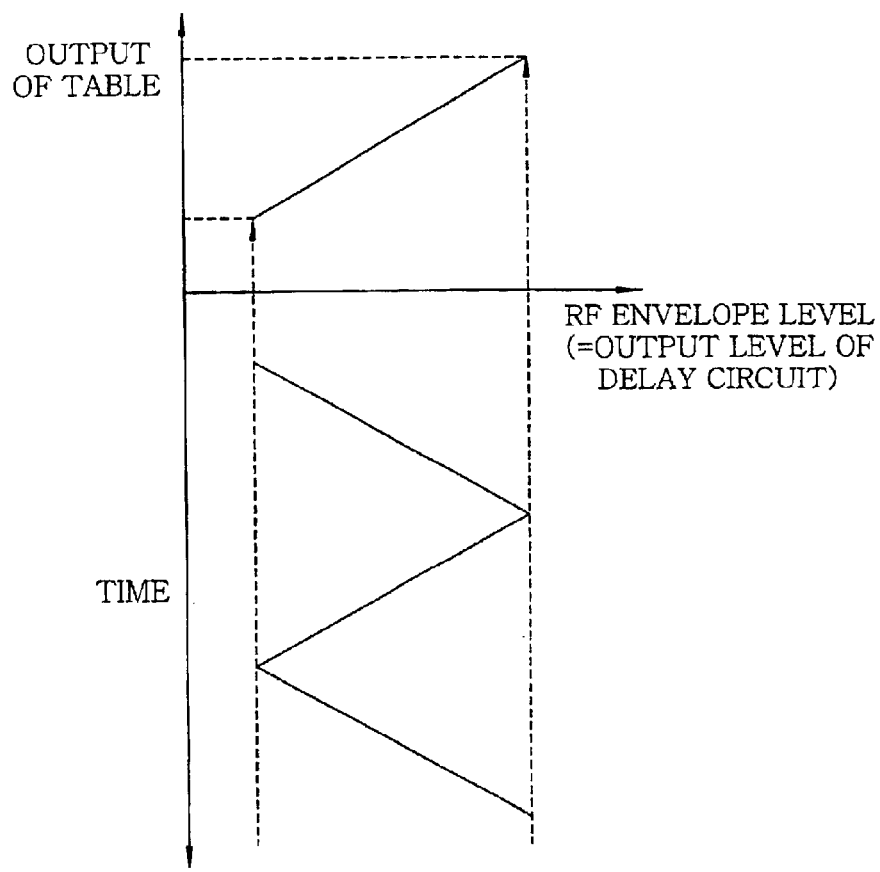
FIG. 15 exhibits a graph showing relationships between an RF envelope level and time and between the RF envelope level and an output of a table included in the circuit shown in FIG. 14.

FIG. 7F describes results of distortion canceling performed on the distortions shown in FIG. 7E by using the distortion canceling circuit shown in FIG. 14. As shown in 7F, the distortion canceling circuit of the prior art can cancel the distortion, which is represented as the vector (a+b), by generating a negative vector {−(a+b)} with respect to the vector (a+b). However, a distortion represented as a vector (xb) remains after the distortion canceling performed on the distortion at the frequency of (2·f2−f1).

Figure 7G:
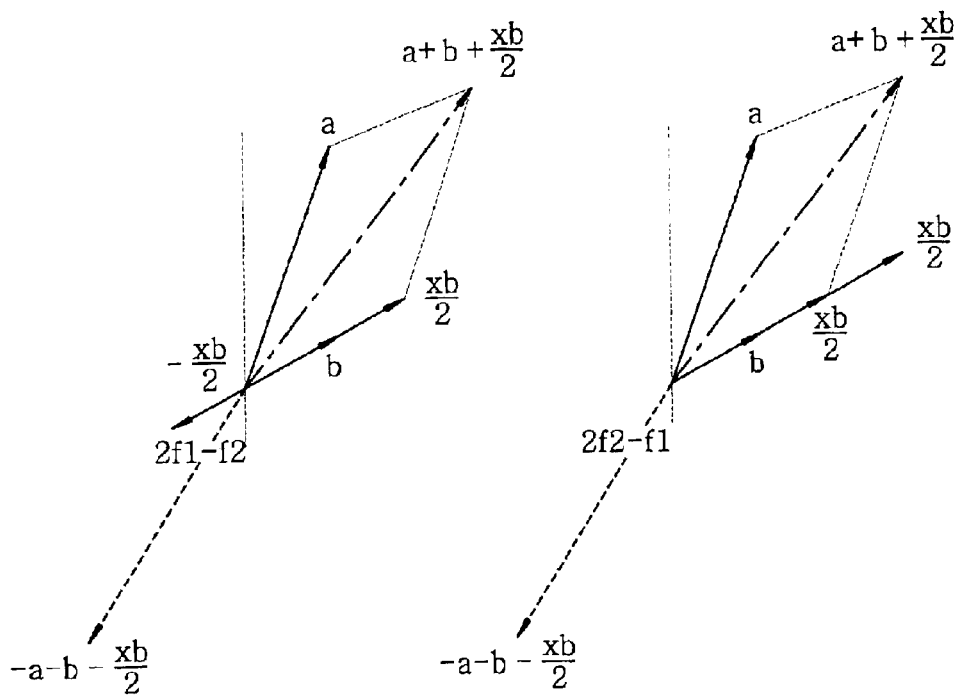

Meanwhile, as shown in FIG. 7G, the vector b at the frequency of (2·f1−f2) can be divided into several terms like as {b+(xb/2)−(xb/2)}; and the vector {(1+x)b} at the frequency of (2·f2−f1) can be divided into several terms like as {b+(xb/2)+(xb/2)}. In this case, if the distortion canceling circuit performs on the vectors by generating a distortion represented as a vector {−a−b−(xb/2)}, distortions represented as vectors (−xb/2) and (+xb/2) remain at the frequencies of (2·f1−f2) and (2·f2−f1), respectively, thereafter.

Figure 7H:
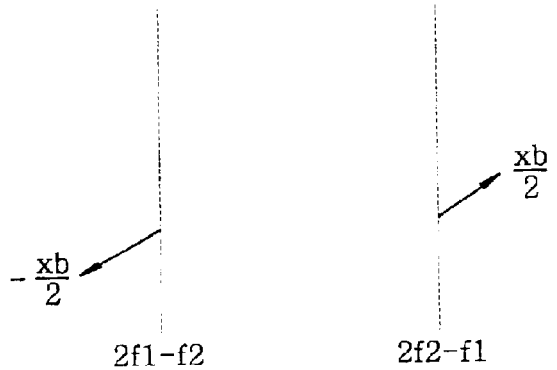

Two distortion components shown in FIG. 7H represent PM (phase modulation) components since each of them has an identical amplitude but a phase difference of 180° with respect to each other. Such PM components can be canceled by performing phase modulation on the input signal having the frequencies of f1 and f2, to thereby generate distortions having characteristics opposite to those of the PM components.

Figure 8:
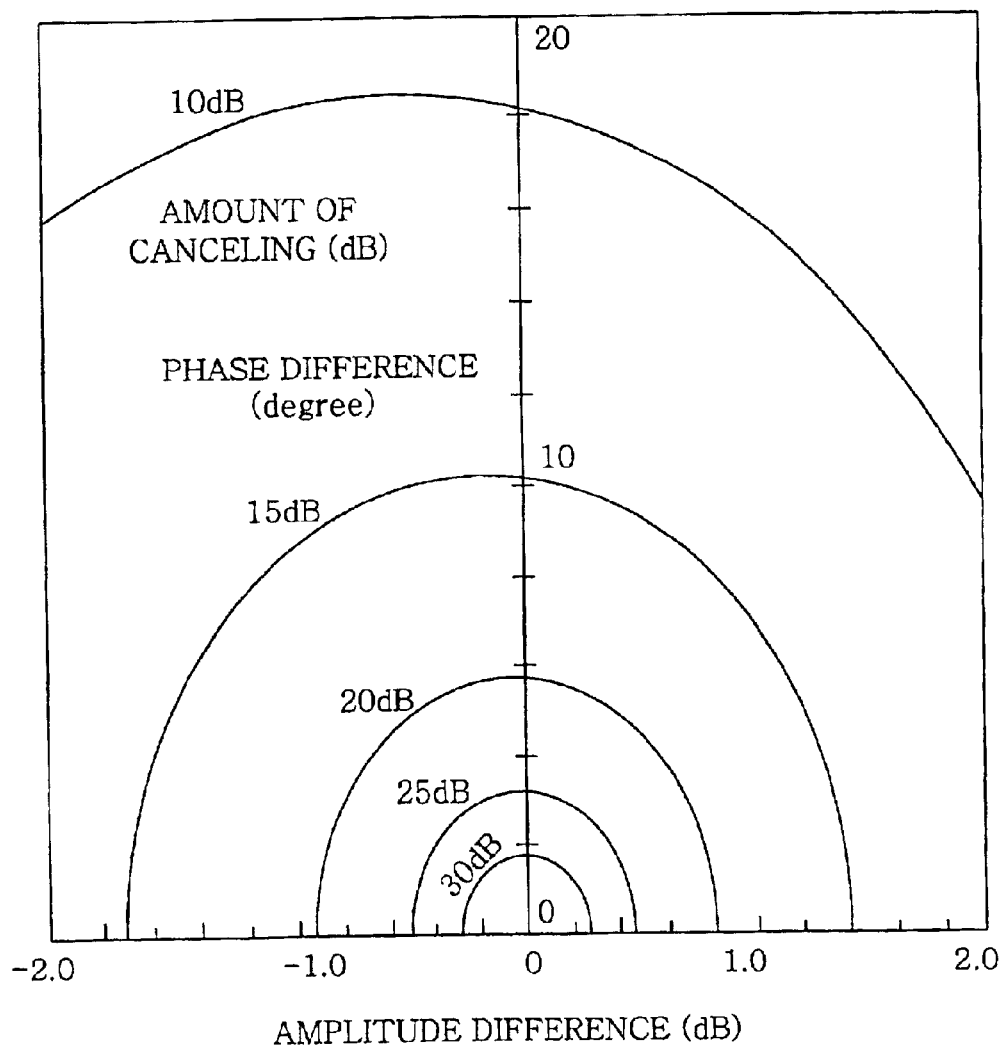
FIG. 8 illustrates a graph showing a relationship between an amount of distortion canceling and amplitude and phase differences.

FIG. 8 illustrates a graph showing the amount of distortion canceling for phase and amplitude differences between the additional distortions shown in FIG. 7D. In FIG. 8, the horizontal and vertical axes represent an amplitude difference (dB) and a phase difference (degree), respectively. As shown in FIG. 8, if there exist no phase difference therebetween, the amount of canceling of 10 dB or 15 dB can be obtained in case θ2 is 20° or 10°, respectively.

Figure 11:
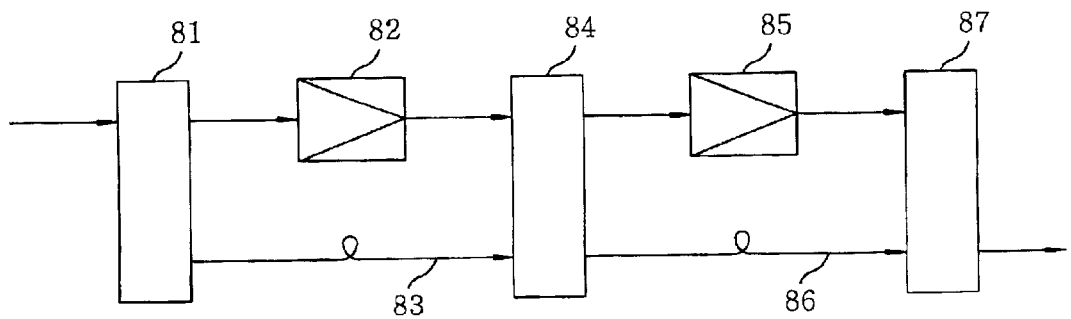
FIG. 11 depicts a conventional amplifying device including a distortion canceling circuit adopting a feed-forward method.
Figure 16:
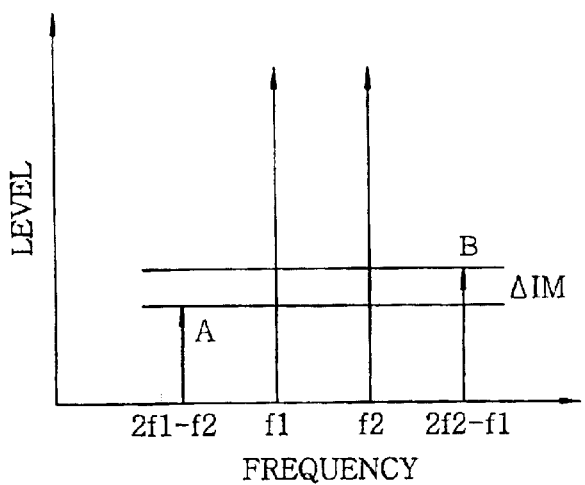
FIG. 16 illustrates an exemplary signal inputted to an amplifier and distortions generated by the amplifier.

Accordingly, in case the unbalance between the higher and lower 3rd order distortions is ΔIM=2 dB as shown in FIG. 16, the amount of canceling of 19 dB can be obtained by using the distortion canceling circuit adopting pre-distortion method of FIG. 14. Moreover, by using the distortion canceling method of the present invention, a further amount of canceling of 10 to 15 dB can be obtained, such that a total amount of canceling becomes 29 to 34 dB. Therefore, the distortion canceling method of the present invention has canceling efficiency not less than that of the distortion canceling circuit adopting the feed-forward method of FIG. 11.

Hereinafter, the underlying theory of the phase modulation will be described.

If a signal $\cos(\omega c \cdot t)$ (wherein t and ωc represent time and an angular frequency, respectively) is phase-modulated in accordance with a degree of modulation of φ and a phase frequency of p, in general, a modulated signal y can be expressed like as Equation (1).

$$y=\cos\{(\omega c \cdot t)+\phi \cdot \sin(p \cdot t)\} \quad \text{Equation (1)}$$

In Equation (1), when φ is considerably small, the modulated signal y can be approximated by Equation (2).

$$y=\cos(\omega c \cdot t)+(\phi/2)\cdot\cos\{(\omega c+p)\cdot t\}-(\phi/2)\cdot\cos\{(\omega c-p)\cdot t\} \quad \text{Equation (2)}$$

Figure 12:
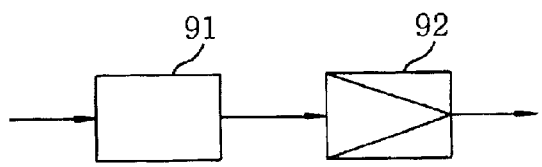
FIG. 12 charts a conventional amplifying device including a distortion canceling circuit adopting a pre-distortion method.
Figure 13A:
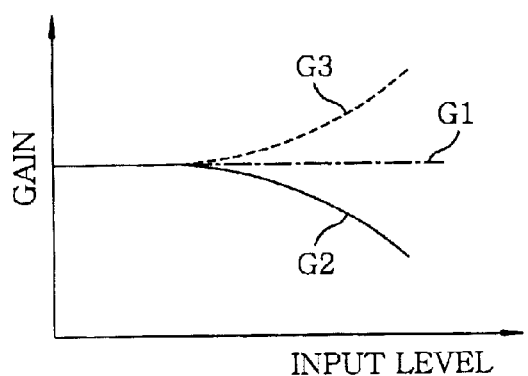
FIGS. 13A and 13B illustrates graphs to show the non-linear characteristic of an amplifier and the operation of a pre-distortion circuit.
Figure 13B:
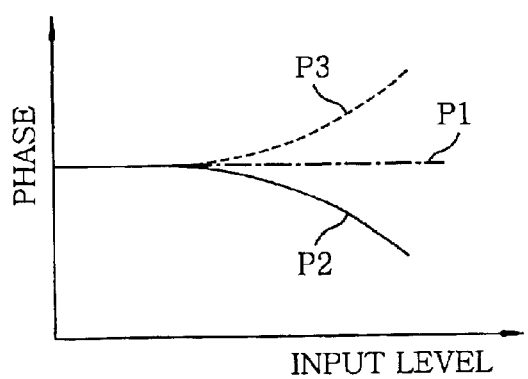

In Equation (2), second and third terms of the right side have the positive and the negative sign, respectively, which means that each of the second and the third term has a phase difference of 180° with respect to each other. If the distortion components at the frequencies of (2·f1−f2) and (2·f2−f1) after the distortion canceling performed by the circuit of FIGS. 12 or 14 are considered to be equivalents of the modulated signals represented as Equation (1) or (2), ωc becomes an angular frequency ω1 or ω2 corresponding to the frequency of f1 or f2, respectively. Further, p becomes (ω2−ω1).

In the present invention, to cancel the distortions represented as Equation (1) or (2), it is assumed that signals $\cos(\omega 1 \cdot t)$ and $\cos(\omega 2 \cdot t)$, each of which has an angular frequency ω1 or ω2 (the frequency of f1 or f2), are phase-modulated compulsorily in the outside of the amplifier in accordance with a degree of modulation φ, a modulation frequency Δω=(ω2−ω1) and a phase θ. In this case, when φ is considerably small, modulated signals y1 and y2 corresponding to the angular frequencies ω1 and ω2 can be approximated by Equations (3) and (4), respectively. Further, a signal $[\phi \cdot \sin\{(\Delta\omega \cdot t)+\theta\}]$ having an angular frequency Δω=(ω2−ω1) corresponding to Δf=(f2−f1) is used as the control signal of the present invention.

$$\begin{aligned} y1 &= \cos[(\omega 1 \cdot t) + \varphi \cdot \sin\{(\Delta\omega \cdot t) + \theta\}] \quad \text{Equation (3)} \\ &= \cos(\omega 1 \cdot t) + (\varphi/2)\cdot\cos\{(\omega 1 + \Delta\omega)\cdot t\} + \theta\} - \\ & \quad (\varphi/2)\cdot\cos\{(\omega 1 - \Delta\omega)\cdot t - \theta\} \\ &= \cos(\omega 1 \cdot t) + (\varphi/2)\cdot\cos\{(\omega 2 \cdot t) + \theta\} - \\ & \quad (\varphi/2)\cdot\cos\{(\omega 1 - \Delta\omega)\cdot t - \theta\} \end{aligned}$$

$$y2=\cos(\omega 2 \cdot t)+(\phi/2)\cdot\cos\{(\omega 2+\Delta\omega)\cdot t+\theta\}-(\phi/2)\cdot\cos\{(\omega 1 \cdot t) \quad \text{Equation (4)}$$

If it is assumed that (φ/2)<<1, the sum of the signals y1 and y2 can be approximated by a signal y3 of Equation (5). Further, the distortion components shown in FIG. 7H can be represented as a signal y4 of Equation (6).

$$y3=y1+y2 \quad \text{Equation (5)}$$
$$=\cos(\omega 1 \cdot t)+\cos(\omega 2 \cdot t)+(\phi/2)\cdot\cos\{(\omega 2+\Delta\omega)\cdot t+\theta\}-(\phi/2)\cdot\cos\{(\omega 1-\Delta\omega)\cdot t-\theta\}$$

$$y4=\{(x \cdot b)/2\}\cdot\cos\{(\omega 2+\Delta\omega)\cdot t+\theta 2\}-\{(x \cdot b)/2\}\cdot\cos\{(\omega 1-\Delta\omega)\cdot t+\theta 2\} \quad \text{Equation (6)}$$

A third term and a fourth term of the right side of Equation (5) corresponds to a first term and a second term of the right side of Equation (6), respectively. Accordingly, it is possible to cancel the unbalance between the distortion components at the frequencies of (2·f1−f2) and (2·f2−f1), respectively, if (φ/2)=−(x·b)/2, θ=0 and θ2=0.

Further, when θ2 shown in FIG. 7D is considerably small, e.g., 10° to 20°, an amount of canceling of 10 to 15 dB can be obtained, to thereby improve the efficiency of the distortion canceling process.

FIGS. 9A to 9D exhibit exemplary signal spectra obtained through phase modulation performed on a main signal. In FIGS. 9A to 9D, the horizontal and vertical axes represent frequency and signal level, respectively.

Figure 9A:
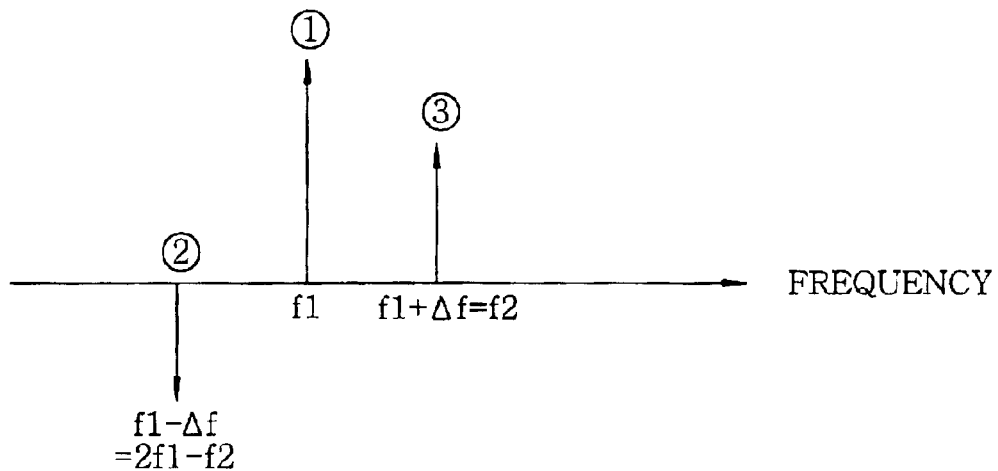
FIGS. 9A to 9D exhibit exemplary signal spectra obtained through phase modulation performed on main signals.

FIG. 9A depicts signal spectra obtained through phase modulation performed on a main signal having the frequency of f1 by using a signal having the frequency of Δf=(f2−f1) as the control signal of the present invention. As shown in FIG. 9A, when the main signal (1) having the frequency of f1 is phase-modulated, lower and higher side-band signals (2) and (3) are generated at the frequencies of (2·f1−f2) and f2, respectively.

Figure 9B:
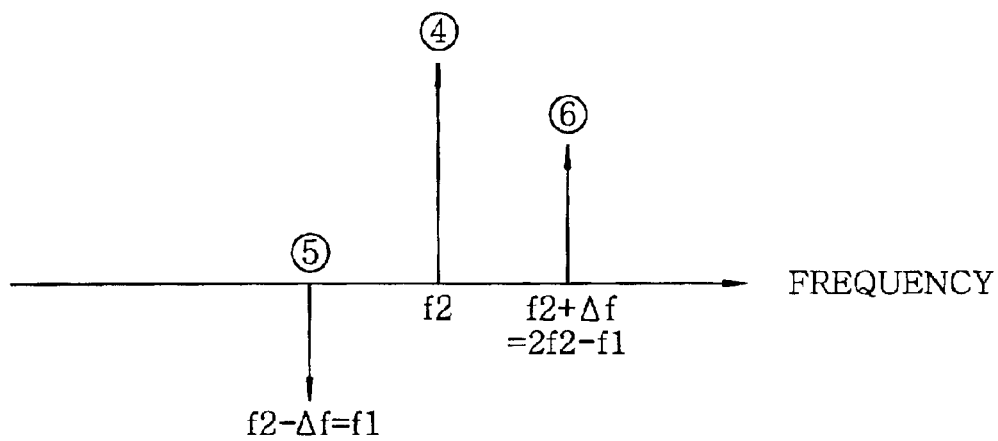

FIG. 9B shows signal spectra obtained through phase modulation performed on a main signal having the frequency of f2 by using a signal having the frequency of Δf=(f2−f1) as the control signal of the present invention. As shown in FIG. 9B, when the main signal (4) having the frequency of f2 is phase-modulated, lower and higher side-band signals (5) and (6) are generated at the frequencies of f1 and (2·f2−f1), respectively.

Figure 9C:
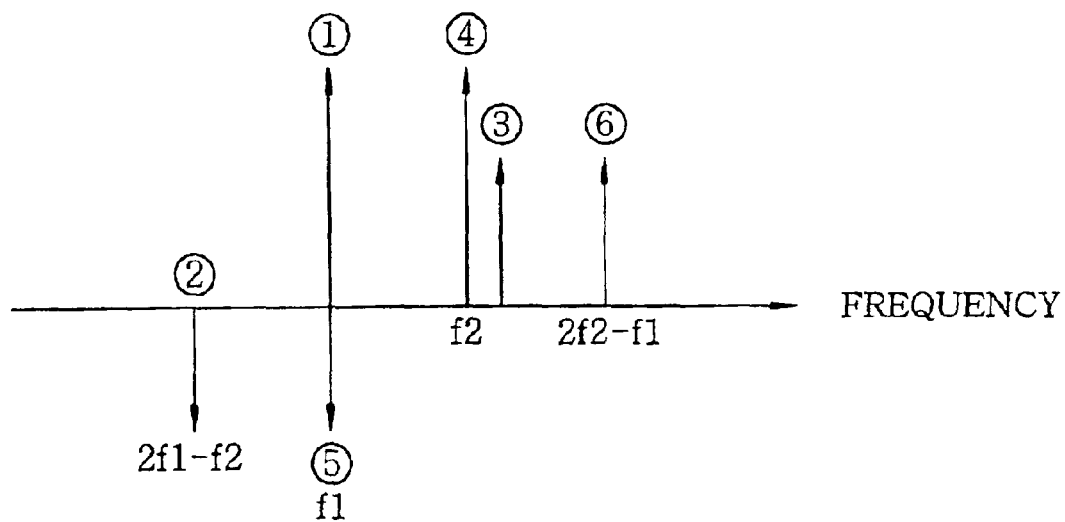

FIG. 9C charts together the signal spectra shown in FIGS. 9A and 9B.

Figure 9D:
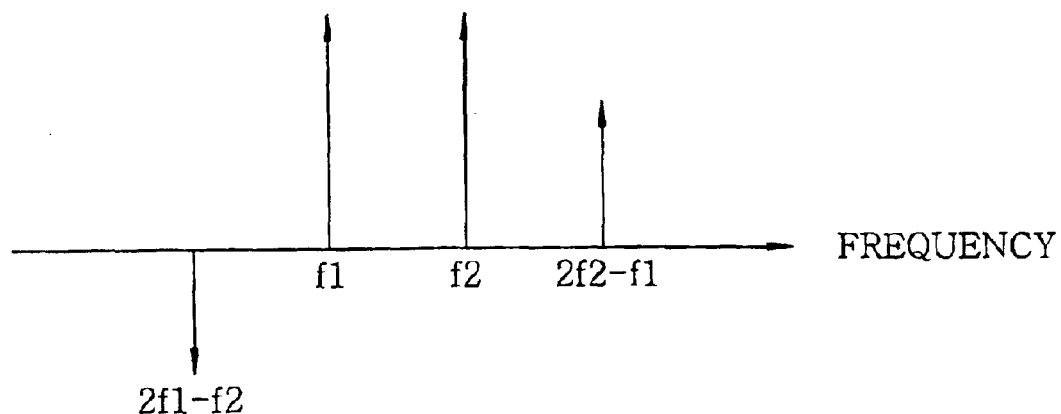

In FIG. 9C, the degree of phase modulation is assumed to be considerably small, such that the levels of the distortions (2), (3), (5) and (6) are much smaller than those of the main signals (1) and (4). Accordingly, the sum of the main signal (1) and the distortion (5) can be considered to approximate the main signal (1), and the sum of the main signal (4) and the distortion (3) can be considered to approximate the main signal (4). FIG. 9D shows the results of the summation of the signal spectra of FIGS. 9A and 9B.

Further, the component Δω=(ω2−ω1) can be detected, e.g., by performing square detection on a signal $z=\sin(\omega 1 \cdot t)+\sin(\omega 2 \cdot t)$ which is to be amplified by the amplifier. Here, Δω corresponds to the frequency difference of Δf=(f2−f1), which corresponds to each of the differences between (2·f2−f1) and f2, between f2 and f1 and between f1 and (2·f1−f2).

The result of performing square detection on the signal z, i.e., $y^2(=z^2)$, is shown in Equation (7).

$$\begin{aligned} y^2 &= \sin^2(\omega 1 \cdot t) + 2 \cdot \{\sin(\omega 1 \cdot t)\} \cdot \{\sin(\omega 2 \cdot t)\} + \\ & \quad \sin^2(\omega 2 \cdot t) \\ &= \{1 - \cos(2 \cdot \omega 1 \cdot t)\}/2 + \cos\{(\omega 2 - \omega 1)\cdot t\} - \\ & \quad \cos\{(\omega 2 + \omega 1)\cdot t\} + \{1 - \cos(2 \cdot \omega 2 \cdot t)\}/2 \end{aligned} \quad \text{Equation (7)}$$

In Equation (7), the component Δω=(ω2−ω1) can be obtained by extracting a second term of the right side. In this case, the remaining terms, i.e., first, third and fourth terms of the right side can be removed, e.g., by performing frequency filtering thereon.

In the meanwhile, in case ΔIM shown in FIG. 16 varies according to the frequency difference of Δf=(f2−f1), it is necessary to change the degree of modulation φ in accordance with the frequency difference of Δf.

Next, an underlying principle of performing phase modulation by using a capacitance which varies according to the level of an input signal.

Figure 10A:
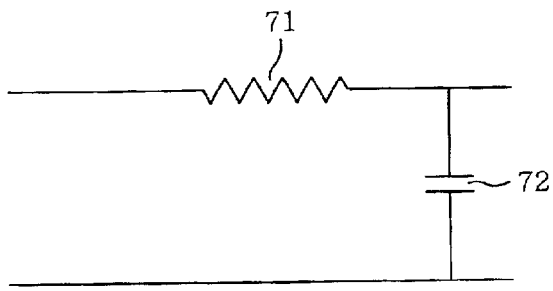
FIGS. 10A and 10B show a circuit and a graph to explain an underlying principle of phase modulation performed by varying a capacitance of a condenser.
Figure 10B:
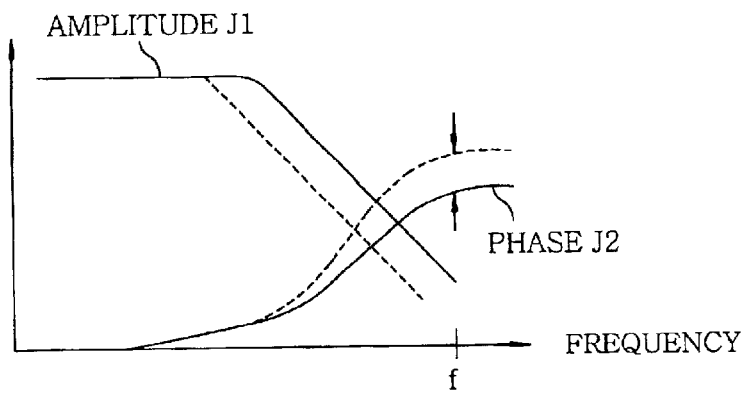

FIG. 10A describes an exemplary circuit including a resistor 71 and a condenser 72. FIG. 10B illustrates a graph showing examples of amplitude (J1) and phase (J2) characteristics of the circuit shown in FIG. 10A. In FIG. 10B, the horizontal axis represents frequency.

As shown in FIG. 10B, as the capacitance of the condenser 72 increases, the amplitude (J1) and phase (J2) characteristics represented as solid lines change to those represented as dotted lines. In this way, the phase modulation can be performed by varying the capacitance of the condenser 72 at a specific frequency f. In particular, e.g., at a frequency q of a signal $y=\sin\{(\omega c \cdot t)+q\}$, the phase modulation can be performed by varying the capacitance of the condenser 72 by using a signal having a frequency Δf=(f2−f1) as the control signal of the present invention.

In the following, an amplifying device in accordance with a first preferred embodiment of the present invention will be described with reference to the drawings.

FIG. 1 illustrates an exemplary configuration of an amplifying device including a distortion canceling circuit adopting a distortion canceling method in accordance with the present invention. The amplifying device of FIG. 1 includes a branch circuit 1, a square detector 2, a level controller 3, a PM (phase modulation) modulator 4 and a main amplifier 5.

The branch circuit 1 outputs an RF signal having frequencies of f1 and f2 to the PM modulator 4 as an input signal thereof. At the same time, a part of the RF signal from the branch circuit is outputted to the square detector 2.

The square detector 2 performs square detection on the RF signal from the branch circuit 1, to thereby obtain a signal having a frequency of Δf=(f2−f1) (hereinafter referred to as Δf component). The Δf component is outputted to the level controller 3.

The level controller 3, e.g., which includes an amplifier, amplifies the Δf component to thereby output the amplified Δf component to the PM modulator 4 as a modulation signal. Further, in case the level controller 3 includes an attenuator, the level controller 3 attenuates the Δf component to thereby output the attenuated Δf component to the PM modulator 4 as a modulation signal. Here, the degree of amplification or attenuation performed by the level controller 3 is set such that the PM modulator 4 can perform phase modulation on the RF signal in an optimal state.

Further, the level controller 3 may or may not invert the phase of the input signal (i.e., a change of the phase of 180° or 0°), depending on, e.g., the polarity of the Δf component and the PM modulator 4. As described above, i.e., in FIG. 7D, when θ2 is considerably small, the amount of distortion canceling becomes 10 to 15 dB, as shown in FIG. 8, which means an improvement of the distortion canceling process.

Further, the phase inverting or non-inverting function of the level controller can be performed by one of level controllers 13, 28, 43 and 58 shown in FIGS. 2 to 4A and 6, respectively.

Further, it is also possible to position a phase controller, which changes a phase of a signal, between the square detector 2 and the level controller 3 or between the level controller 3 and the PM modulator 4, to thereby adjust the phase of the Δf component.

In the first preferred embodiment of the present invention, an LPF (low pass filter), which filters out frequency components except the Δf component included in the signal outputted from the square detector 2, may be inserted into between the square detector 2 and the level controller 3.

The PM modulator 4 performs phase modulation on the input signal from the branch circuit 1 by using, as a modulation signal (control signal), the Δf component inputted from the level controller 3, and then, outputs the phase-modulated signal to the main amplifier 5.

The main amplifier 5, e.g., a common amplifier, amplifies the phase modulated signal inputted from the PM modulator 4.

As shown in FIG. 7H, the PM modulator 4 generates side-band signals to cancel the unbalance between the higher 3rd order distortion at the frequency (2·f2−f1) and the lower 3rd order distortion at the frequency (2·f1−f2), the distortions having a same amplitude and a phase difference of 180° with respect to each other.

In this case, after summing the side-band signals generated by the PM modulator 4 and the distortions generated by the main amplifier 5, only distortion components having the identical amplitude and phase remain at the frequencies of (2·f1−f2) and (2·f2−f1). Such remaining distortions can be removed by using the pre-distortion circuit shown in FIG. 12 or 14.

Figure 2:
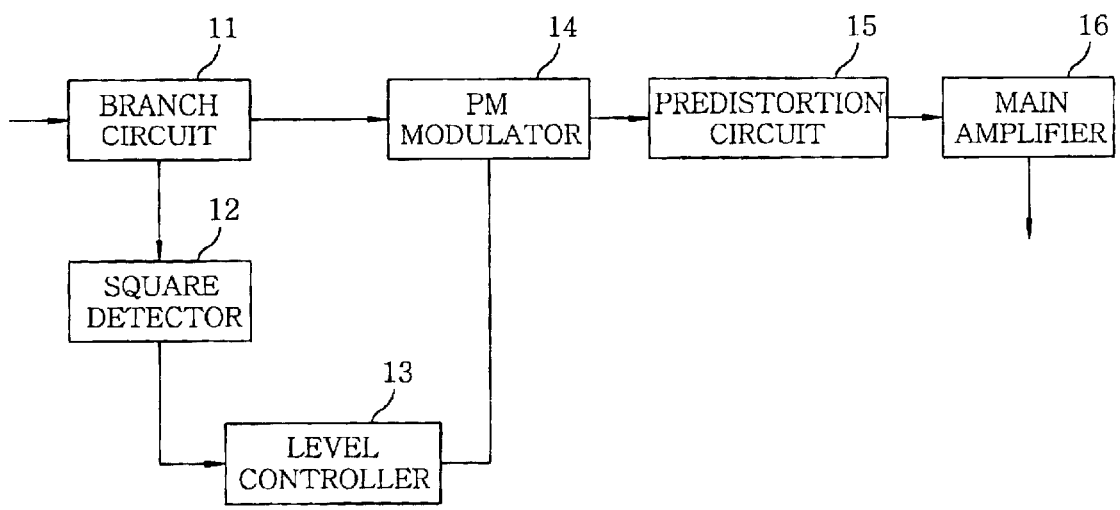
FIG. 2 exhibits another exemplary configuration of an amplifying device including the distortion canceling circuit in accordance with the first preferred embodiment of the present invention.

FIG. 2 exemplifies a configuration of an amplifying device that includes the pre-distortion circuit shown in FIG. 12 together with the distortion canceling circuit shown in FIG. 1. The amplifying device of FIG. 2 includes a branch circuit 11, a square detector 12, a level controller 13, a PM modulator 14, a pre-distortion circuit 15 and a main amplifier 16.

The branch circuit 11, the square detector 12, the level controller 13 and the PM modulator 14 operate in the same way as those of FIG. 1. That is, the PM modulator 14 outputs a modulated input signal, which is modulated based on a Δf component, to the pre-distortion circuit 15. And then, the pre-distortion circuit 15 generates distortions for the input signal inputted from the PM modulator 14. The input signal distorted by the pre-distortion circuit 15 is outputted to the main amplifier 16. The main amplifier 16 amplifies the distorted input signal.

In the amplifying device of FIG. 2, the higher and lower side-band signals and the higher and lower 3rd order distortions are summed at the frequencies of (2·f1−f2) and (2·f2−f1), respectively, such that the resultant signals have same amplitudes as the distortions and a phase difference of 180° with respect to the distortions, the distortions being generated at the frequencies of (2·f1−f2) and (2·f2−f1) by the main amplifier 16, to thereby cancel the distortions generated by the main amplifier 16.

That is, the pre-distortion circuit 15 generates distortions to cancel the distortion components represented as the vector {a+b+(xb/2)} in FIG. 7G, and the PM modulator 14 generates side-band signals to cancel the distortion components represented as the vectors −(xb/2) and +(xb/2) in FIG. 7H.

Further, on condition that the side-band signals and the distortions generated by the PM modulator 14 and the pre-distortion circuit 15, respectively, can be applied to the input signal, the pre-distortion circuit 15 can be positioned anywhere, e.g., between the branch circuit 11 and the PM modulator 14 in the amplifying device of FIG. 2.

Figure 3:
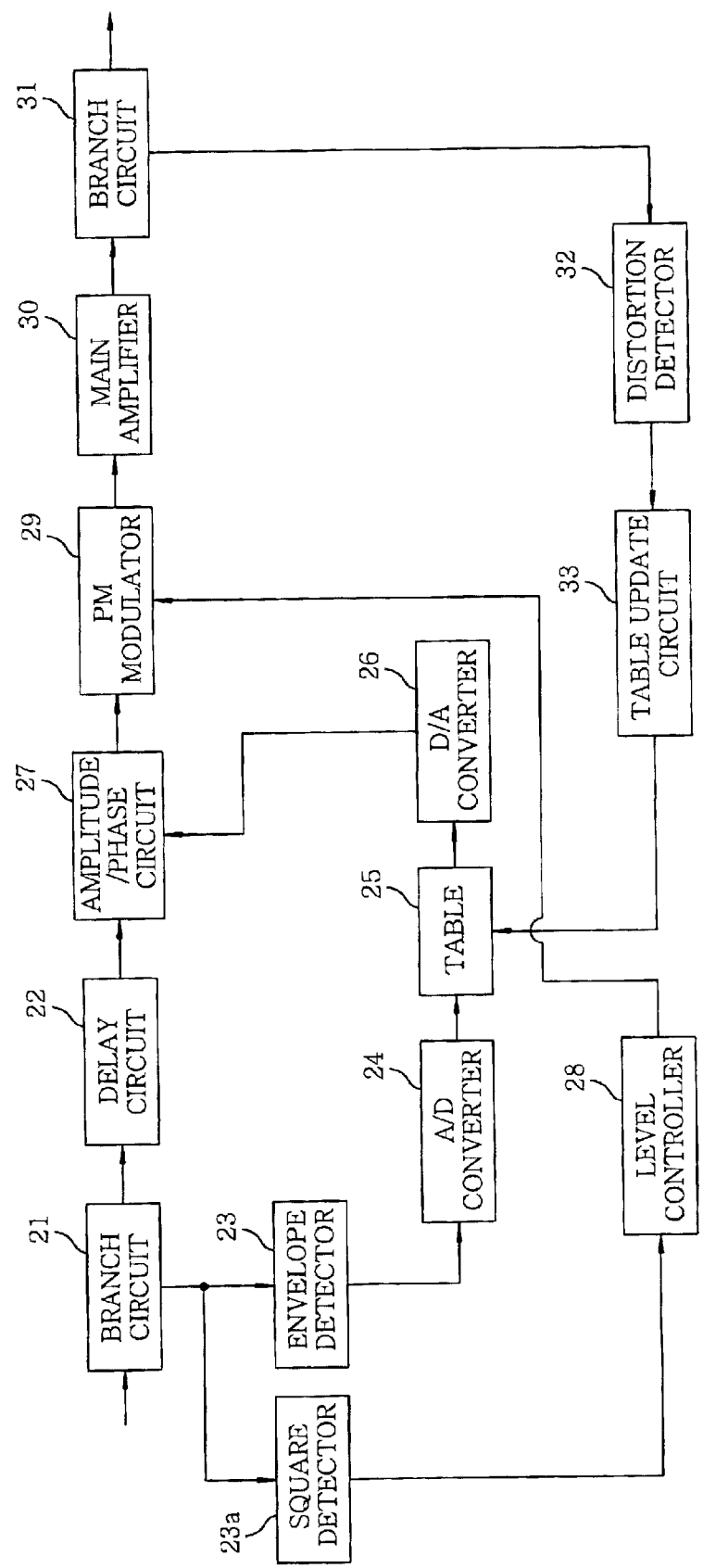
FIG. 3 shows still another exemplary configuration of an amplifying device including the distortion canceling circuit in accordance with the first preferred embodiment of the present invention.

FIG. 3 shows another configuration of an amplifying device including the distortion canceling circuit in accordance with the first preferred embodiment of the present invention. The amplifying device shown in FIG. 3 includes the distortion canceling circuit shown in FIG. 1 together with the one shown in FIG. 14. The amplifying device includes a branch circuit 21, a delay circuit 22, an envelope detector (amplitude detector) 23, a square detector 23a, an A/D converter 24, a table 25, a D/A converter 26, an amplitude/phase circuit 27, a level controller 28, a PM modulator 29, a main amplifier 30, another branch circuit 31, a distortion detector 32 and a table update circuit 33.

The branch circuit 21, the delay circuit 22, the envelope detector 23, the A/D converter 24, the table 25, the D/A converter 26, the amplitude/phase circuit 27, the branch circuit 31, the distortion detector 32 and the table update circuit 33 operate in the same way as those shown in FIG. 14. That is, a signal, to which distortions generated by the amplitude/phase circuit 27 are added, is outputted to the PM modulator 29.

In the meanwhile, the branch circuit 21, the square detector 23a, the level controller 28 and the PM modulator 29 operate in the same way as those shown in FIG. 1. Accordingly, based on a $\Delta f$ component from the level controller 28, the PM modulator 29 performs phase modulation on a signal inputted from the amplitude/phase circuit 27, the modulated signal being outputted to the main amplifier 30. And then, the modulated signal is amplified by the main amplifier 30 to be outputted through the branch circuit 31.

In the amplifying device shown in FIG. 3, higher and lower 3rd order distortions generated by the amplitude/phase circuit 27 and higher and lower side-band signals generated by the PM modulator 29 are summed at the frequencies of $(2 \cdot f1-f2)$ and $(2 \cdot f2-f1)$, respectively, such that the resultant signals have same amplitudes as the distortions and a phase difference of 180° with respect to the distortions, the distortions being generated by the main amplifier 30 at the frequencies of $(2 \cdot f1-f2)$ and $(2 \cdot f2-f1)$, to thereby cancel the distortions generated by the main amplifier 30.

That is, the amplitude/phase circuit 27 generates distortions to cancel the distortion components represented as the vector $\{a+b+(xb/2)\}$ in FIG. 7G, and the PM modulator 29 generates side-band signals to cancel the distortion components represented as the vectors $-(xb/2)$ and $+(xb/2)$ in FIG. 7H.

Further, on condition that the side-band signals and the distortions generated by the PM modulator 29 and the amplitude/phase circuit 27, respectively, can be applied to the input signal, the PM modulator 29 can be positioned anywhere, e.g., between the branch circuit 21 and the delay circuit 22 or between the delay circuit 22 and the amplitude/phase circuit 27, in the amplifying device shown in FIG. 3.

An amplifying device in accordance with a second preferred embodiment of the present invention now will be described.

Figure 4A:
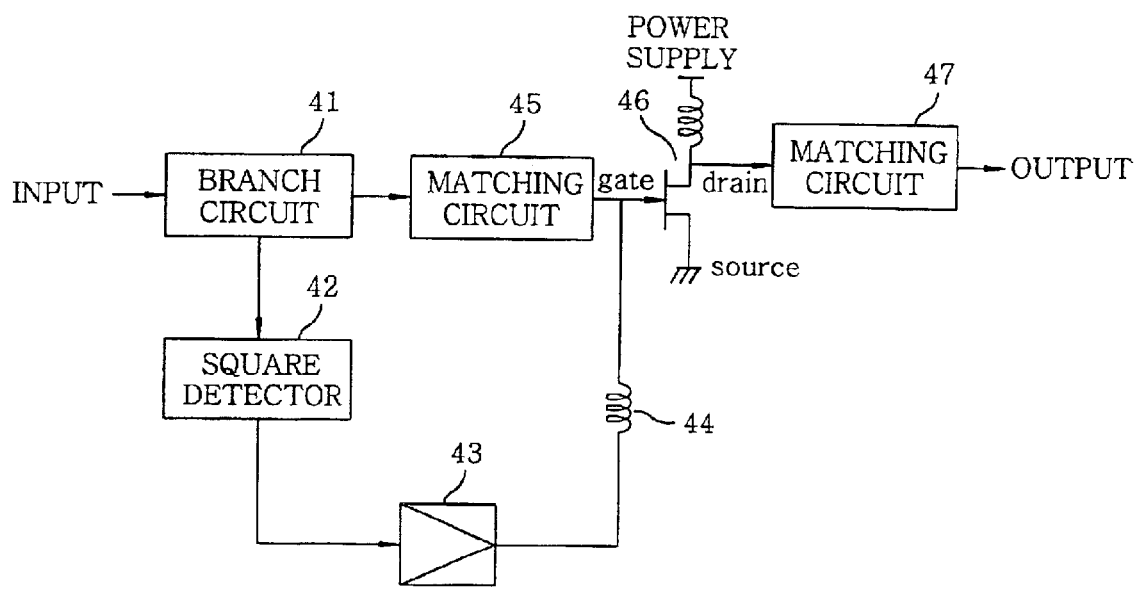
FIGS. 4A and 4B depict an exemplary configuration of an amplifying device including a distortion canceling circuit in accordance with a second preferred embodiment of the present invention.

FIG. 4A exhibits an exemplary configuration of an amplifying device including a distortion canceling circuit in accordance with the second preferred embodiment of the present invention. The amplifying device includes a branch circuit 41, a square detector 42, a level controller 43, a high-frequency inductor 44, an input matching circuit 45, a transistor 46 and an output matching circuit 47.

The branch circuit 41 outputs an RF signal having frequencies of f1 and f2 to a gate of the transistor 46 through the matching circuit 45. At the same time, a part of the RF signal from the branch circuit 41 is outputted to the square detector 42.

The square detector 42 performs square detection on the RF signal from the branch circuit 41, to thereby obtain a signal having a frequency of $\Delta f=(f2-f1)$. The detected signal, i.e., $\Delta f$ component, is outputted to the level controller 43.

The level controller 43, e.g., which includes an amplifier, amplifies the $\Delta f$ component and outputs the amplified $\Delta f$ component to the gate of the transistor 46 through the high-frequency inductor 44 as a modulation signal (control signal). As described in the first embodiment of the present invention, the level controller 43 may include an attenuator.

Further, it is also possible to position a phase controller, which changes a phase of a signal, between the square detector 42 and the level controller 43 or between the level controller 43 and the high-frequency inductor 44, to thereby adjust the phase of the $\Delta f$ component.

The high-frequency inductor 44 filters out high-frequency components, i.e., f1 and f2, included in the main signal outputted from the level controller 43 while allowing a low-frequency component, i.e., the $\Delta f$ component, to pass therethrough and be subsequently outputted to the gate of the transistor 46. That is, the high-frequency inductor 44 operates as a filter to extract the $\Delta f$ component from the signal outputted from the square detector 42.

The input matching circuit 45 is an impedance matching circuit for amplifying efficiently the main signal having the frequencies of f1 and f2 in the transistor 46. The transistor 46 has its input impedance and also a source of the main signal has its output impedance. Accordingly, in order to amplifying efficiently the main signal in the transistor 46, each of the input impedance and the output impedance should be a conjugate with respect to each other. The matching circuit 45 implements such a conjugate relation therebetween.

Likewise, the output matching circuit 47 performs an impedance matching between its input and output.

The transistor 46, e.g., which comprises a main amplifier including a common amplifier, inputs the main signal outputted from the matching circuit 45 and the $\Delta f$ component outputted from the high-frequency inductor 44 through the gate thereof. And then, the transistor amplifies the inputted signal and outputs the amplified signal to the matching circuit 47 through the drain thereof. Further, a power supply is coupled to the drain of the transistor 46, and the source of the transistor 46 is coupled to a ground.

Figure 4B:
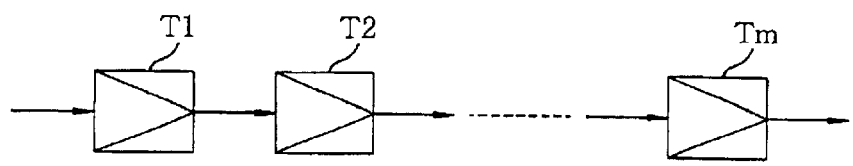

In this embodiment, to facilitate the explanation, the number of transistors 46 is assumed to be 1. However, in general, the main amplifier includes m transistors T1 to Tm connected in series as shown in FIG. 4B, wherein m is an integer larger than or equal to 2. In this case, the $\Delta f$ component may be supplied to a gate of one of the transistors, to thereby perform phase modulation, which will be described later.

Figure 5:
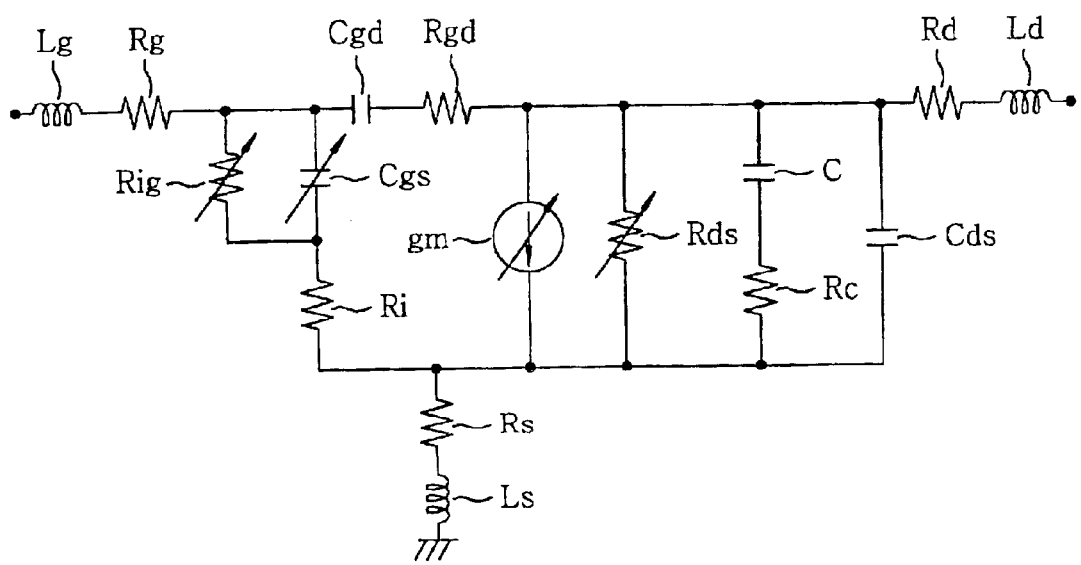
FIG. 5 exemplifies an equivalent circuit of a transistor.

FIG. 5 charts an exemplary equivalent circuit of the transistor 46, i.e., a FET. In FIG. 5, (Lg, Ld and Ls) refer to inductances; (Rg, Rd, Rgd, Ri, Rc and Rs) refer to resistances; (Cgd, C and Cds) refer to capacitances; (Rig and Rds) refer to variable resistors; (Cgs) refers to a variable capacitance having voltage dependency; and (gm) refers to a rate at which a drain current changes as a gate voltage varies. A more detailed description on the equivalent circuit of FIG. 5 is given in Takaki and Mori, "Basics of Low-Distortion Amplifier Design," MWE2000 Microwave Workshop Digest T5-1.

In the circuit of FIG. 5, the main signal, which has the frequencies of f1 and f2, is assumed to be outputted from the matching circuit 45 and is inputted to the gate of the transistor 46. In this case, the drain current varies as the gate voltage varies in accordance with a voltage of the main signal, thereby the main signal being amplified. Further, the capacitance Cgs changes in accordance with the change of the gate voltage. In this way, the AM-PM conversion is performed in the transistor 46, which results in IM distortions at the frequencies of (2·f1−f2) and (2·f2−f1).

Further, in the circuit of FIG. 5, the Δf component is inputted from the high-frequency inductor 44 to the gate, such that the capacitance (Cgs) changes, thereby the main signal being phase-modulated as described with reference to FIG. 10. That is, in this embodiment of the present invention, the capacitance (Cgs) may be adjusted externally by using a signal having the frequency of Δf, which results in phase modulation of the main signal. In this way, the phase modulation performed by the PM modulator of the first preferred embodiment of the present invention can be also realized in this embodiment.

Meanwhile, (gm) changes as the gate voltage varies, which means that amplitude modulation of the main signal is performed. In this case, it is preferable that the degree of the phase modulation is larger than that of the amplitude modulation. Further, although the amplitude modulation is performed, this causes only the vector (xb/2) of FIG. 7G to increase, which does not introduce any further problem in distortion canceling.

In this embodiment, the transistor 46 performs phase modulation on the main signal to thereby generate side-band signals to cancel the unbalance between the higher 3rd order distortion at the frequency of (2·f2−f1) and the lower 3rd order distortion at the frequency of (2·f1−f2), the distortions having a same amplitude and a phase difference of 180° with respect to each other.

In this case, after summing the side-band signals generated by the phase modulation performed by the transistor 46 and the distortions generated by the main amplifier comprising the transistor 46, only distortion components having the identical amplitude and phase remain at the frequencies of (2·f1−f2) and (2·f2−f1). Such remaining distortions can be removed by using the pre-distortion circuit shown in FIG. 12 or 14.

Figure 6:
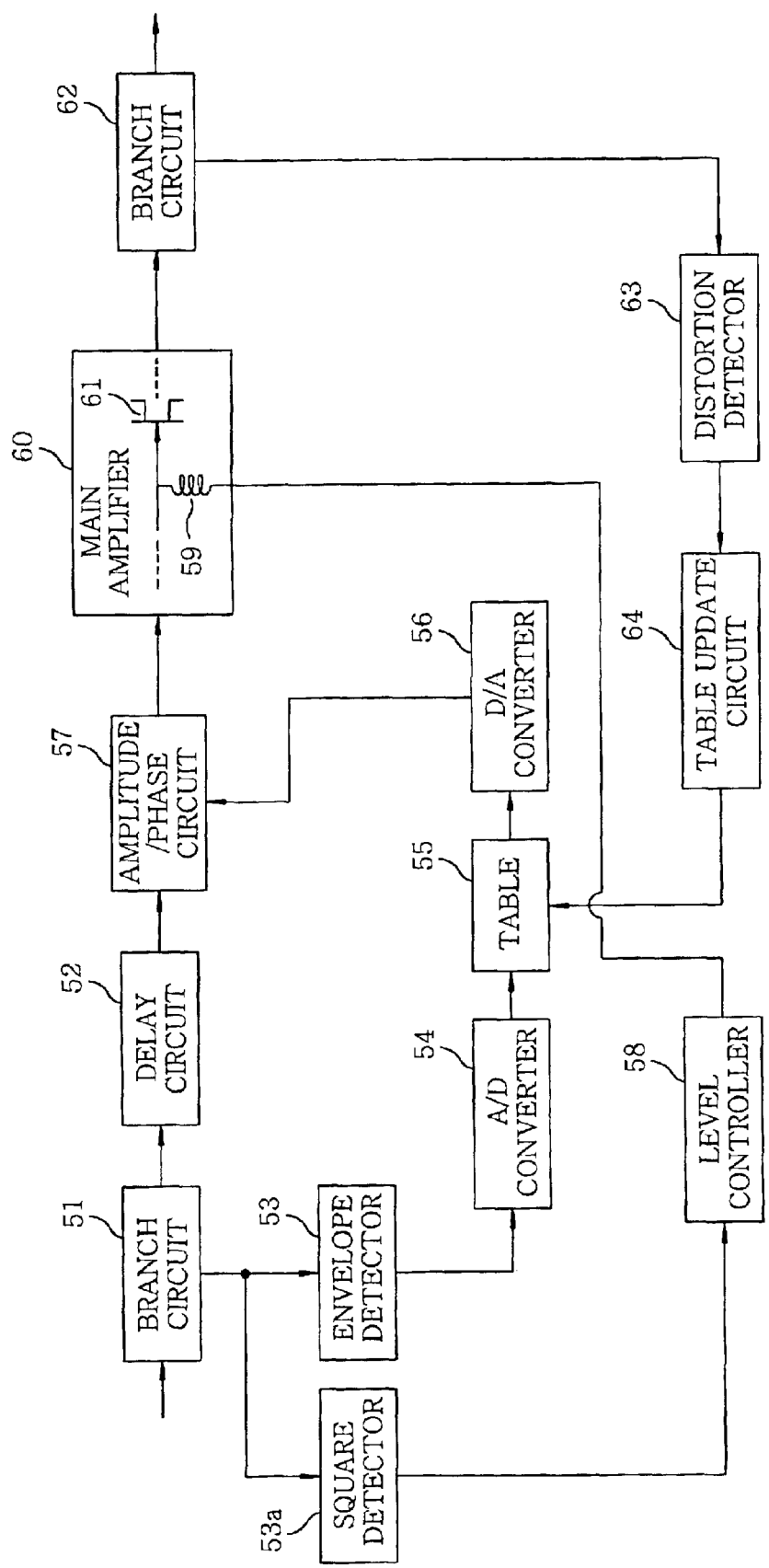
FIG. 6 describes another exemplary configuration of amplifying device including the distortion canceling circuit in accordance with the second preferred embodiment of the present invention.

FIG. 6 shows an exemplary configuration of an amplifying device including the distortion canceling circuit in accordance with the second preferred embodiment of the present invention. That is, the amplifying device of FIG. 6 includes the distortion canceling circuit shown in FIG. 4A together with that shown in FIG. 14. The amplifying device includes a branch circuit 51, a delay circuit 52, an envelope detector (amplitude detector) 53, a square detector 53a, an A/D converter 54, a table 55, a D/A converter 56, an amplitude/phase circuit 57, a level controller 58, a high-frequency inductor 59, a main amplifier 60 which includes a transistor 61, another branch circuit 62, a distortion detector 63 and a table update circuit 64.

The branch circuit 51, the delay circuit 52, the envelope detector 53, the A/D converter 54, the table 55, the D/A converter 56, the amplitude/phase circuit 57, the branch circuit 62, the distortion detector 63 and the table update circuit 64 operate in the same way as those shown in FIG. 14. That is, a signal, to which distortions generated by the amplitude/phase circuit 57 are added, is outputted to the main amplifier 60.

In the meanwhile, the branch circuit 51, the square detector 53a, the level controller 58 and the high-frequency inductor 59 operate in the same way as those shown in FIG. 4A. Accordingly, based on a Δf component from the level controller 58, the transistor 61 performs phase modulation on a signal inputted from the amplitude/phase circuit 57, the modulated signal being outputted to the main amplifier 60. And then, the modulated signal is amplified by the main amplifier 60 to be outputted through the branch circuit 62.

In the amplifying device of FIG. 6, higher and lower 3rd order distortions generated by the amplitude/phase circuit 57 and higher and lower side-band signals generated by the transistor 61 are summed at the frequencies of (2·f1−f2) and (2·f2−f1), respectively, such that the resultant signals have same amplitudes as the distortions and a phase difference of 180° with respect to the distortions, the distortions being generated by the main amplifier 60 at the frequencies of (2·f1−f2) and (2·f2−f1), to thereby cancel the distortions generated by the main amplifier 60.

That is, the amplitude/phase circuit 57 generates distortions to cancel the distortion components represented as the vector {a+b+(xb/2)} in FIG. 7G, and the transistor 61 generates side-band signals to cancel the distortion components represented as the vectors −(xb/2) and +(xb/2) in FIG. 7H.

Further, although not illustrated in the drawings, the pre-distortion circuit shown in FIG. 12 can be inserted into between the branch circuit 41 and the matching 45 shown in FIG. 4A or between the matching circuit 45 and the main amplifier. That is, the amplifying device of the present invention can be configured to include the distortion canceling circuit shown in FIG. 12 and the distortion canceling circuit shown in FIG. 4A.

In this configuration, higher and lower 3rd order distortions generated by the pre-distortion circuit and higher and lower side-band signals generated by the transistor are summed at the frequencies of (2·f1−f2) and (2·f2−f1), respectively, such that the resultant signals have same amplitudes as the distortions and a phase difference of 180° with respect to the distortions, the distortions being generated by the main amplifier at the frequencies of (2·f1−f2) and (2·f2−f1), to thereby cancel the distortions generated by the main amplifier.

That is, the pre-distortion circuit generates distortions to cancel the distortion components represented as the vector {a+b+(xb/2)} in FIG. 7G, and the transistor generates side-band signals to cancel the distortion components represented as the vectors −(xb/2) and +(xb/2) in FIG. 7H.

The application area of the distortion canceling circuit of the present invention is not limited to those describe above. For instance, an amplifying device including the distortion canceling circuit in accordance with the present invention is suitable for use in a transmitter for transmitting a signal, e.g., a W-CDMA signal or a multi-carrier signal.

The amplifying device in accordance with the present invention can be configured to have hardware resources including a processor and a memory wherein the processor executes a control program stored in the memory (ROM) to control the amplifying device. Further, the elements of the amplifying device can be configured as an independent hardware circuit.

The control program can be stored in a storage medium, such as a floppy disk or a CD-ROM, which can be readable by a computer. In this case, the control program is loaded to the memory from the storage media so that the control program can be executed by the processor.

While the invention has been shown and described with respect to the preferred embodiments, it will be understood by those skilled in the art that various changes and modifications may be made without departing from the spirit and scope of the invention as defined in the following claims.

What is claimed is:

1. A distortion canceling circuit for reducing an unbalance between a higher 3rd order distortion and a lower 3rd order distortion generated by an amplifier which amplifies an input signal having at least two frequency components, the distortion canceling circuit comprising:

phase modulation means for performing phase modulation on the input signal by using a control signal having a frequency corresponding to a difference between the frequency components wherein the distortion canceling circuit cancels the unbalance by using side-band signals generated as a result of the phase modulation performed by the phase modulation means.

2. The distortion canceling circuit of claim 1, wherein a capacitance between a gate and a source of a transistor operates as the phase modulation means, the transistor being included in the amplifier and the capacitance being variable in accordance with a voltage of the control signal applied to the gate.

3. The distortion canceling circuit of claim 1, further comprising:

a pre-distortion circuit, which is positioned in front of the amplifier, for canceling the higher 3rd order distortion and the lower 3rd order distortion.

* * * * *